United States Patent [19]

Amma et al.

[11] Patent Number: 5,856,747
[45] Date of Patent: Jan. 5, 1999

[54] INPUT SIGNAL DETERMINING METHOD AND APPARATUS

[75] Inventors: Mitsuru Amma; Jiro Shiota, both of Shizuoka, Japan

[73] Assignee: Yazaki Corporation, Tokyo, Japan

[21] Appl. No.: 818,449

[22] Filed: Mar. 17, 1997

[51] Int. Cl.⁶ .................................................. H03K 5/00
[52] U.S. Cl. ................................................ 327/18; 327/20
[58] Field of Search .................................. 327/18, 20, 21, 327/23–27, 208–213

[56] References Cited

U.S. PATENT DOCUMENTS 4,475,219  10/1984  Puckette ..................................... 375/82
5,257,287  10/1993  Blumenthal et al. ..................... 375/19

FOREIGN PATENT DOCUMENTS 1-215113  8/1989  Japan ........................................ 327/18
4-186913  7/1992  Japan ........................................ 327/18

*Primary Examiner*—Tuan T. Lam
*Attorney, Agent, or Firm*—Sughrue, Mion, Zinn, Macpeak & Seas, PLLC

[57] ABSTRACT

In an input signal determining method and an apparatus for practicing the method, the level of an input signal is detected at least twice with a predetermined period, if the level of the input signal is significant when detected firstly, then before the second detection is started which is carried out in the predetermined period, whether or not the input signal is a continuous input signal whose level is maintained unchanged for a predetermined time is determined, and if the input signal is not the continuous input signal, the result of the first detection is reset, and if the level of the input signal is maintained for the predetermined time, and the level of the input signal is significant when detected secondly, then the input signal is determined as a correct input signal, whereby the erroneous recognition of the input signal can be avoided, and a noise equal in period to the synchronizing signal can be eliminated.

4 Claims, 5 Drawing Sheets

| TEST POINT | LOGIC VALUE | | | | |
|---|---|---|---|---|---|
| TP | T1 | T2 | T3 | T4 | T5 |
| 1 | L | H | L | H | L |
| 2 | H | H | H | H | H |
| 3 | L | L | L | H | L |
| 4 | H | L | H | L | L |
| 5 | H | H | H | H | L |
| 6 | H | H | H | H | H |
| 7 | H | H | H | H | L |
| 8 | L | H | H | H | H |

FIG. 5

| TEST POINT | LOGIC VALUE | | | |
|---|---|---|---|---|
| TP | T11 | T12 | T13 | T14 |
| 1 | L | H | L | H |
| 2 | H | H | L | L |
| 3 | L | L | L | L |
| 4 | H | L | H | L |
| 5 | H | H | L | L |
| 6 | H | H | H | H |
| 7 | H | H | H | H |
| 8 | L | H | H | L |

INPUT SIGNAL DETERMINING METHOD AND APPARATUS

BACKGROUND OF THE INVENTION

1. Field of the Invention

This invention relates to an input signal determining method and an apparatus for practicing the method, and more particularly to an input signal determining method and an apparatus for practicing the method which are applied to an electronic unit for a motor vehicle.

2. Description of the Related Art

In order to eliminate interference signals such as bound noises due to the chattering or vibration of switches, and external noises, a conventional electronic unit on a motor vehicle employs an apparatus based on a particular input signal determining method. The conventional apparatus of this type is as shown in FIG. 6.

As shown in FIG. 6, an input signal determining apparatus 30 comprises three series-connected first, second and third D-type flip-flop circuits 31, 32 and 33, an OR element, and three NAND elements. An input signal is applied through a terminal 35 to the D terminal of the first D-type flip-flop circuit 31, and its logic level is provided at the Q terminal. The logic level is applied to the D terminal of the second D-type flip-flop circuit 32. An output provided at the Q terminal of the D-type flip-flop circuit 32 is applied to the D terminal of the third D-type flip-flop circuit 33. A synchronizing signal is applied through a terminal 34 to those three D-type flip-flop circuits 31, 32 and 33. A reset signal is applied through a terminal 36 to the reset terminals of the D-type flip-flop circuits 31, 32 and 33.

The input signal is determined or judged based on the logic level of the input signal and the logic levels provided at the Q terminals of the three flip-flop circuits 31, 32 and 33, and the result of the determination is obtained through a terminal 37.

However, in order for the above-described input signal determining method to eliminate the misjudgment of the input signal, it is necessary to employ a number of logic circuits, which are rather troublesome.

In addition, the input signal determining apparatus, employing a number of logic circuits, is expensive. Besides, it is impossible for the apparatus to effectively eliminate synchronous noises.

SUMMARY OF THE INVENTION

In view of the foregoing, an object of the invention is to eliminate the above-described difficulties accompanying the conventional input signal determining method and the conventional input signal determining apparatus.

More specifically, an object of the invention is to provide an input signal determining method in which the misjudgment of an input signal is eliminated although the number of logic circuits is relatively small, and synchronous noises are also effectively eliminated. Another object of the invention is to provide an input signal determining apparatus which is small in the number of logic circuits, low in manufacturing cost, and high in reliability.

The invention provides an input signal determining method in which a level of an input signal is detected at least twice with a predetermined period, comprising the steps of: determining whether or not the input signal is a continuous input signal whose level is maintained unchanged for a predetermined time before a second detection is started which is carried out in the predetermined period if the level of the input signal is significant at a first detection; resetting a result of the first detection if the input signal is not the continuous input signal; and determining the input signal as a correct input signal if the level of the input signal is maintained unchanged for the predetermined time and is significant at the second detection.

The invention also provides an input signal determining apparatus comprising: a first flip-flop circuit which receives at least two synchronizing signals which are produced with a predetermined period, latches an input signal in response to each of the synchronizing signals, and has a reset input terminal; a second flip-flop circuit which receives the at least two synchronizing signals, and latches an output signal of the first flip-flop circuit as an input signal in response to each of the synchronizing signals; and a cancel circuit which is connected to the reset input terminal of the first flip-flop circuit, and applies a reset signal to the reset input terminal if no input signal is available at the time of application of a cancel signal.

BRIEF DESCRIPTION OF THE DRAWINGS

In the accompanying drawings:

FIG. 5 is a diagram showing logic values for the operation of the input signal determining apparatus at the time of generating a non-significant signal.

DETAILED DESCRIPTION OF THE PREFERRED EMBODIMENT

Figure 1:
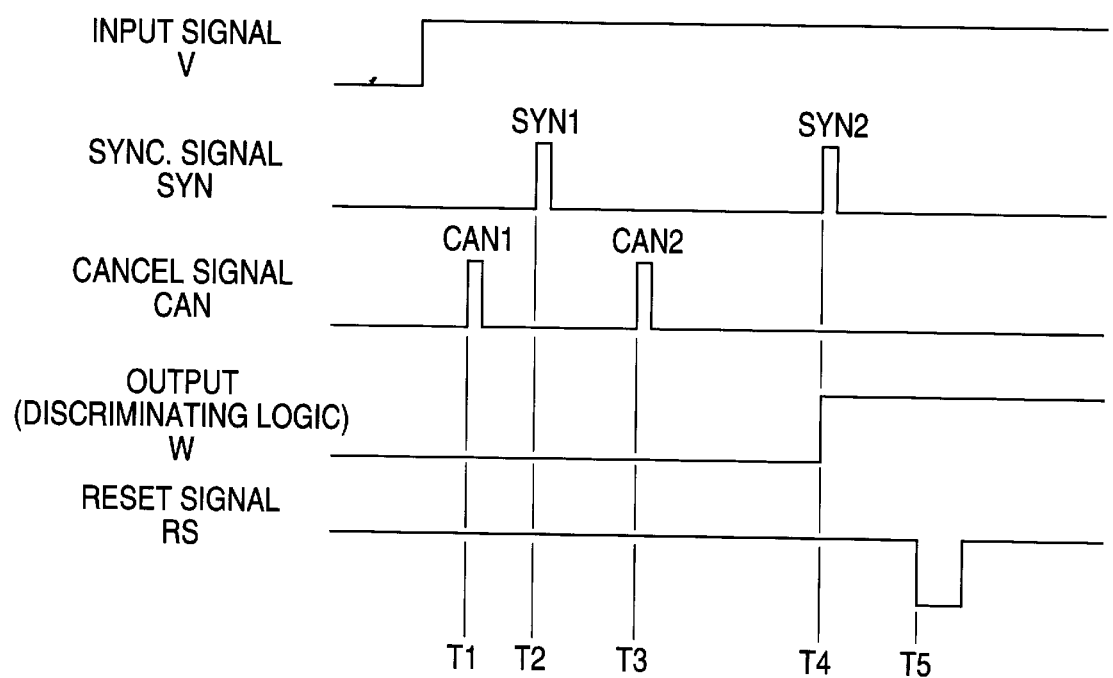
FIG. 1 is a timing chart for a description of an embodiment of an input signal determining method according to the invention.

As shown in FIG. 1, in an input signal determining method according to the invention, the level of an input signal V is detected at least twice in response to at least two synchronizing signals SYN1 and SYN2 which are applied with a predetermined period. If the level of the input signal is significant at the first detection based on the synchronizing signal SYN1, then it is determined whether or not the input signal V is a signal whose level is maintained continuous for a predetermined time according to at least one cancel signal CAN2 which is applied before the second detection is started based on the synchronizing signal SYN2 which is applied in the predetermined period. If it is not a continuous signal, the result of the first detection is reset.

On the other hand, if the level of the input signal V is maintained unchanged for the predetermined time, and at the second detection the level of the input signal is significant, then it is determined that the input signal is a normal input signal.

Figure 2:
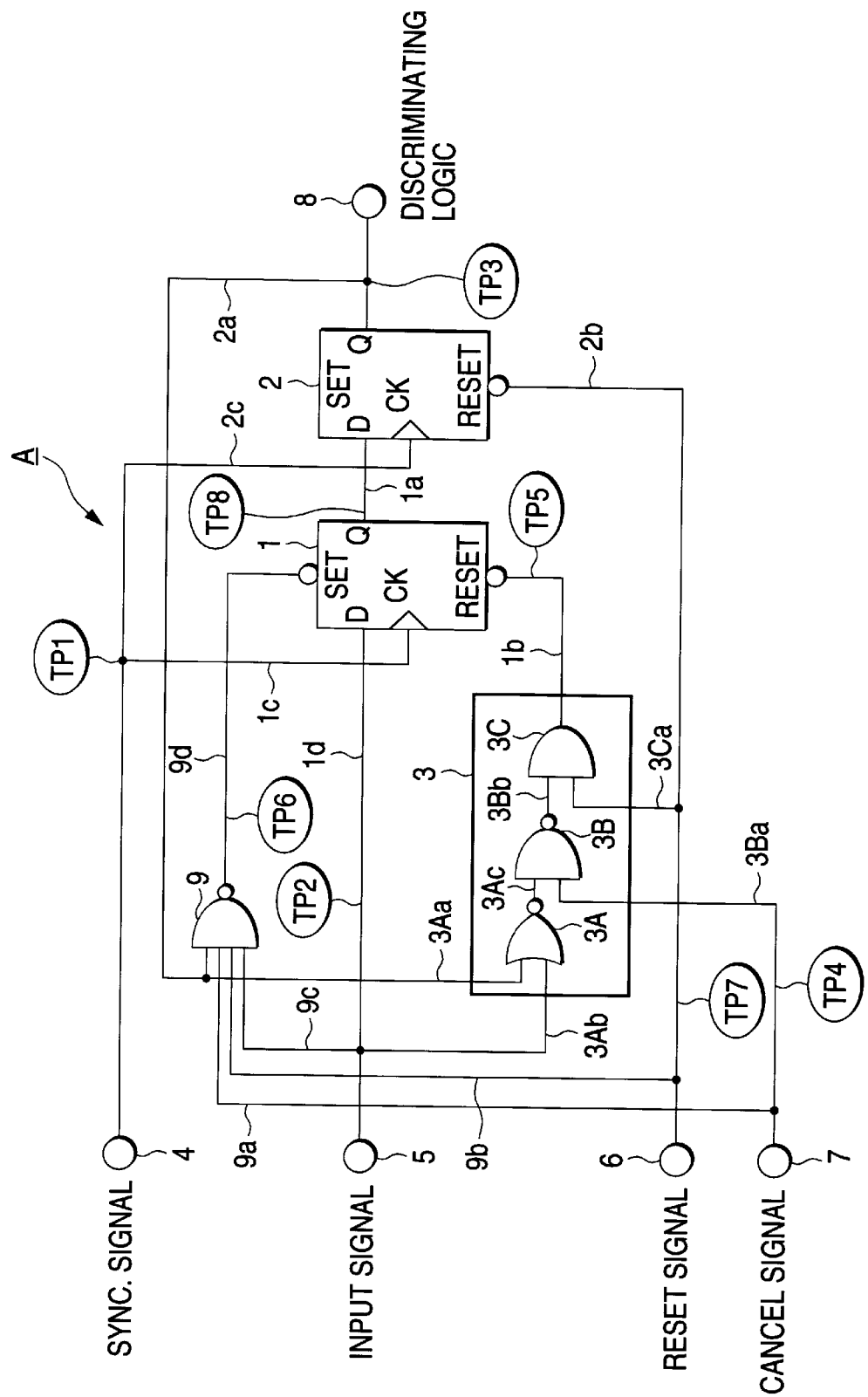
FIG. 2 is a block diagram showing an embodiment of an input signal determining apparatus according to the invention which operates with the timing shown in FIG. 1.

An input signal determining apparatus A according to the invention, as shown in FIG. 2, comprises: a first flip-flop circuit 1; a second flip-flop circuit 2; and a cancel circuit 3. The first flip-flop circuit 1 is a D-type flip-flop circuit which receives at least two synchronizing signals SYN1 and SYN2 which are produced with a predetermined period, and which, upon reception of the synchronizing signals, latches an input applied to the D terminal, and which has a reset input terminal RESET. The second flip-flop circuit 2 is also a D-type flip-flop circuit which receives at least two synchronizing signals SYN1 and SYN2, and which, upon reception of the synchronizing SYN1 and SYN2, latches an output 1a of the first flip-flop circuit 1 as an input signal. The cancel circuit 3 is connected to the reset input terminal RESET of the first flip-flop circuit 1. If, when a cancel signal is applied to the cancel circuit 3, no input signal is applied to the circuit 3, then the circuit 3 supplies a reset signal to the reset input terminal RESET of the first flip-flop circuit 1 to reset the latter 1.

The cancel circuit 3 comprises an NOR element 3A, an NAND element 3B, and an AND element 3C. The NOR element 3A has two input lines 3Aa and 3Ab connected to two input terminals, and one output line 3Ac. The NAND element 3B has: two input terminals which are connected to the aforementioned output line 3Ac and an input line 3Ba, respectively; and one output line 3Bb. The AND element 3C has two input terminals, and one output terminal. One of the input terminals of the AND element 3C is connected to the aforementioned output line 3Bb, and the other to an input line 3Ca. The output terminal of the AND element 3C is connected through an output line 1b to the reset input terminal RESET of the first flip-flop circuit 1.

The apparatus further comprises: a synchronizing-signal inputting terminal 4; an input line 1c connected between the terminal 4 and the CK terminal of the first flip-flop circuit 1; and an input line 2c connected between the terminal 4 and the CK terminal of the second flip-flop circuit 2. The synchronizing signals SYN1 and SYN2 are applied through the terminal 4 and the input lines 1c and 2c to the CK terminals of the first and second flip-flop circuits 1 and 2, respectively.

The apparatus further comprises: an input signal terminal 5; an input line 1d connected between the terminal 5 and the D input terminal of the first flip-flop circuit 1; an output line 1a connected between the Q terminal of the first flop-flop circuit 1 and the D terminal of the second flip-flop circuit 2; a discriminating logic terminal 8; and an output line 2a connected between the Q terminal of the second flip-flop circuit 2 and the terminal 8. The output line 2a is connected to the input line 3Aa which is connected to the input terminal of the NOR element 3A. The terminal 5 is connected to the input line 3Ab which is connected to the NOR element 3A.

The apparatus further comprises: a reset signal inputting terminal 6, which is connected through an input line 2b to the reset input terminal RESET of the second flip-flop circuit 2, and through an input line 3Ca to the AND element 3C; and a cancel signal inputting terminal 7, which is connected through an input line 3Ba to the NAND element 3B.

The apparatus further comprises: an NAND element 9 having four input terminals and one output terminal; input lines 9a, 9b and 9c through which the input terminals of the NAND element 9 are connected to the terminals 7, 6 and 5, respectively; and an input line 9d through which the output terminal of the NAND element 9 is connected to the set input terminal SET of the first flip-flop circuit 1. The remaining input terminal of the NAND element 9 is connected to the output line 2a of the second flip-flop circuit 2.

The synchronizing signal, the cancel signal, etc. are applied through the above-described terminals 4 through 7. The timing of those signals is so selected as to be most suitable for avoiding the effect of the chattering of the operating switches and for eliminating noises.

The input signal, the synchronizing signal, etc. may be ones which are opposite in logic to those described according to FIGS. 1 and 2.

The operation of the input signal determining apparatus of the invention at the time of generating a significant signal, will be described with reference to FIGS. 2 and 3.

When the apparatus A is in the initial state, the output line 1a connected to the Q terminal of the first flip-flop circuit 1 and the output line 2a connected to the Q terminal of the second flip-flop circuit 2 are both at the low level L. In the case where no input signal is applied thereto, one input line 3Ab to the NOR element 3A in the cancel circuit 3 is at the low level L, while the other input line 3Aa connected to the Q terminal of the second flip-flop circuit 2 is also at the low level L. Hence, the output line 3Ac of the NOR element 3A is at the high level H.

In the case where one cancel signal is applied thereto before the synchronizing signal, the input line 3Ba connected to the cancel signal terminal 7 is raised to the high level H, and the output line 3Bb of the NAND element 3b is set to the low level L. Hence, the outline line 1b of the AND element 3C is set to the low level L, and the low level is applied through an inverter to the reset input terminal RESET of the first flip-flop circuit 1; that is, the high level H is applied to the reset input terminal RESET of the first flip-flop circuit 1. As a result, the first flip-flop circuit 1 is reset.

Thereafter, when the first synchronizing signal is applied to the terminal 4 under the condition that no input signal is available, the synchronizing signal is applied to the first and second flip-flop circuits 1 and 2, respectively.

Whereupon, the first flip-flop circuit 1 latches the input line 1d connected between the input signal terminal 5 and its D terminal. However, since no input signal is available, the input line 1d is at the low level L. Therefore, the first flip-flop circuit 1 latches this low level L, and the output line 1a connected to the Q terminal is set to the low level L.

At the same time, the second flip-flop circuit 2 latches the output line 1a extended from the Q terminal of the first flip-flop circuit 1; however, since the output line 1a connected to the D terminal of the second flip-flop circuit 2 is at the low level L, this low level L is latched, and the output line 2a connected to the Q terminal is set to the low level L.

On the other hand, the outputs of the first and second flip-flop circuits due to the application of the synchronizing signal are maintained unchanged in state, and the output of the cancel circuit 3 is also maintained unchanged.

Thereafter, when the cancel signal disappears; that is, when the input line 3Ba connected to the cancel signal terminal 7 is set to the low level L again, the output line 3Bb connected to the NAND element 3B is raised to the high level H. On the other hand, when no reset signal is provided, the reset signal terminal 6 is at the high level H, and therefore the output line 1b of the AND element 3C is at the high level H. This high level of the output line 1b is applied through the inverter to the reset input terminal RESET of the first flip-flop circuit 1; that is, the low level L is applied to the reset input terminal RESET of the first flip-flop circuit 1. Hence, the circuit 1 is not reset.

When, under this condition, the next cancel signal is applied to the cancel signal terminal 7, the input line 3Ba connected to the terminal 7 is raised to the high level H, while the output line 3Bb of the NAND element 3B is set to the low level L. Therefore, the output line 1b of the AND element 3C is set to the low level L, and this low level is applied through the inverter to the reset input terminal RESET of the first flip-flop circuit 1; that is, the high level is applied to the reset input terminal RESET of the circuit 1. Hence the circuit 1 is reset.

After the above-described operation is repeatedly carried out with respect to several cancel signals, the first and second flip-flop circuits 1 and 2 receive the second synchronizing signal at the same time. However, similarly as in the above-described case, the output line 2a extended from the Q terminal of the second flip-flop circuit 2 is at the low level L, and therefore no high level H is applied to the discriminating logic terminal 8 which is connected to the output line 2a. It is correctly determined from the above-described operation that no input signal is available.

Now, the operation of the apparatus in the case where an input signal is applied to the input signal terminal 5, will be described. More specifically, the following case will be described: Similarly as in the above-described case, one cancel signal (CAN1 with the timing T1 in FIG. 1) is applied prior to the synchronizing signal, and thereafter the first synchronizing signal (SYN1 with the timing T2 in FIG. 1) is applied, and then several cancel signals (CAN2 with the timing T3, and so forth in FIG. 1) are applied. Thereafter, the second synchronizing signal (SYN2 with the timing T4 in FIG. 1) is applied, and then the reset signal (RS with the timing T5 in FIG. 1) is applied.

Figures 3, 4:
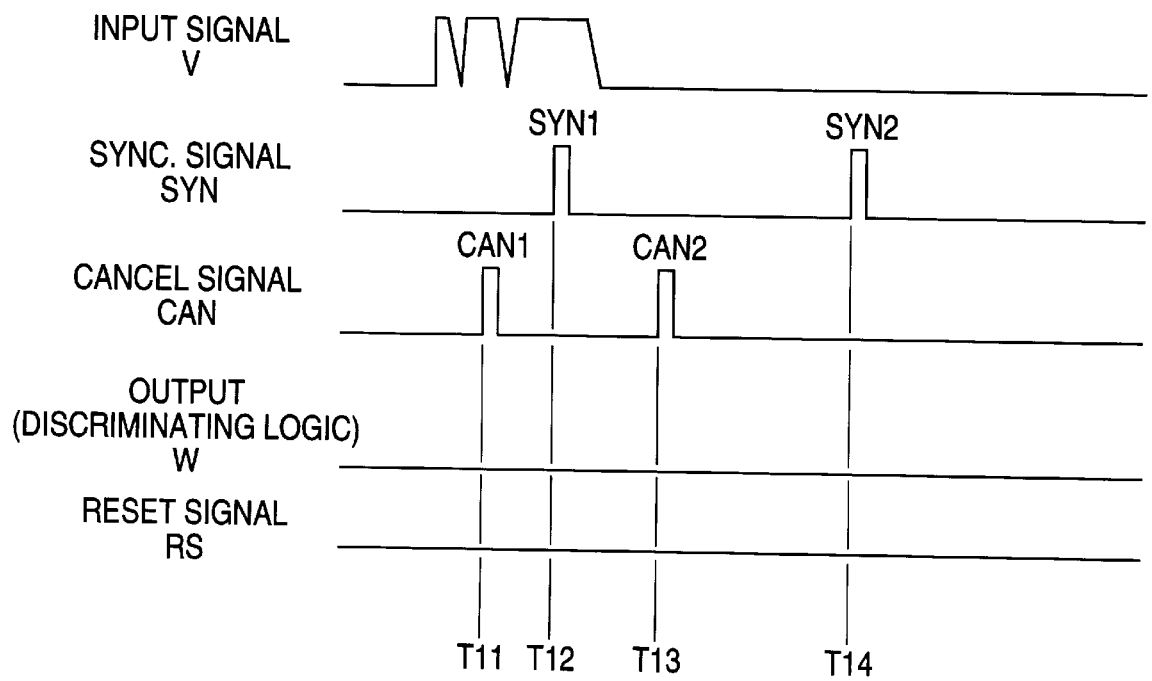
FIG. 3 is a diagram showing logic values for the operation of the input signal determining apparatus at the time of generating a significant input signal.
FIG. 4 is a timing chart for a description of the elimination of a non-significant signal component.
Figure 6:
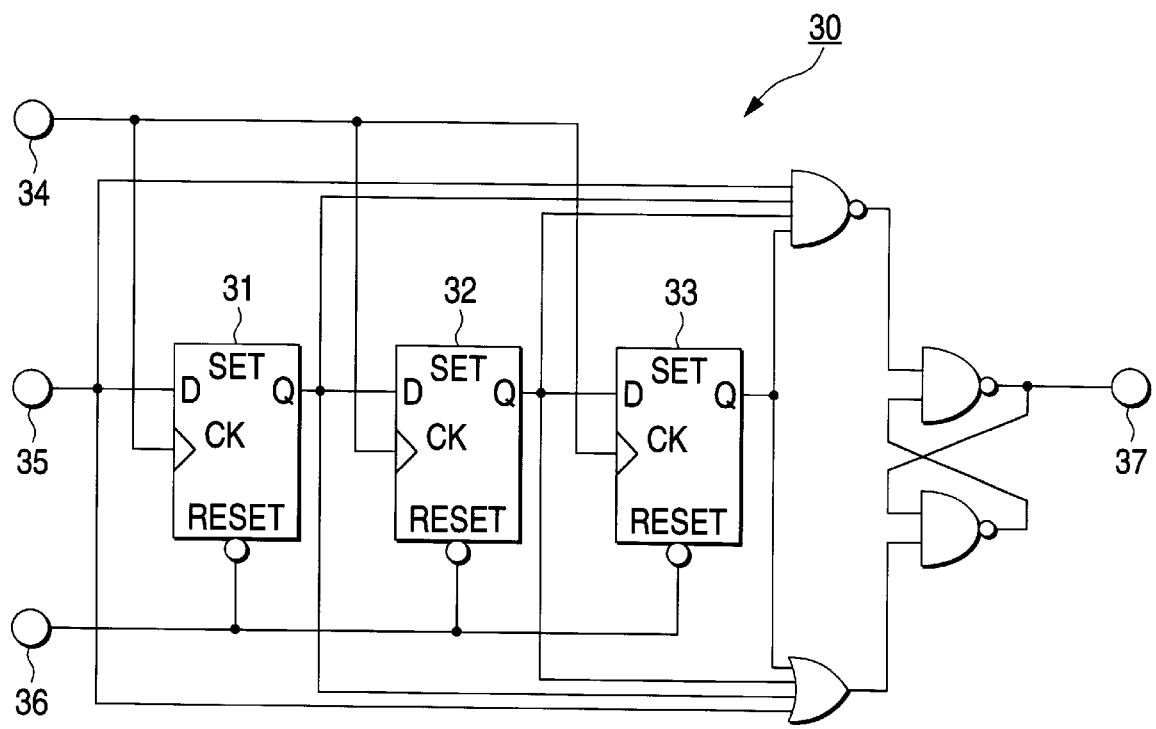
FIG. 6 is a block diagram showing the arrangement of a conventional input signal determining apparatus.

The levels of the input lines and the output lines are indicated in terms of test points TP1 through TP8 with the timing T1 through T5 in FIG. 3.

Even when the initial state that no input signal is present is changed into the state that an input signal is provided at the input signal terminal 5; that is, even when the input line 1d connected to the D terminal of the first flip-flop circuit 1 is raised to the high level H, the output line 2a connected to the Q terminal of the second flip-flop circuit 2 is still at the low level L. Hence, the one input line 3Aa of the NOR element 3A in the cancel circuit 3, which is connected to the output line 2a, is also at the low level, while the other input line 3Ab connected to the input line 1d at the high level H is at the high level H. As a result, the output line 3Ac of the NOR element 3A is at the low level L, and the output line 3Bb of the NAND element 3B whose one input line is the aforementioned output line 3Ac, is at the high level H.

On the other hand, when no reset signal is provided, the reset signal terminal 6 is at the high level H, and the input line 3Ca is also at the high level H. Hence, the output line 1b of the AND element 3C is at the high level H. The high level of the output line 1b is applied through the inverter to the reset input terminal RESET of the first flip-flop circuit 1; that is, the low level L is applied to the reset input terminal RESET of the circuit 1. Therefore, the first flip-flop circuit 1 is not reset.

When one cancel signal (CAN1) is applied with the timing T1 prior to the synchronizing signal, the input line 3Ba connected to the cancel signal terminal 7 is raised to the high level H (T1:TP4). The output line 2a extended from the Q terminal of the second flip-flop circuit 2 is at the low level L, and the one input line 3Aa of the NOR element 3A is also at the low level L; however, since the other input line 3Ab is at the high level H (T1:TP2), the output line 3Ac of the NOR element 3A is set to the low level L while the output line 3Bb of the NAND element 3B is raised to the high level H. Therefore, the output line 1b of the AND element 3C is raised to the high level H (T1:TP5). The high level H is applied through the inverter to the reset input terminal RESET of the first flip-flop circuit 1; that is, the low level L is applied to the terminal RESET of the circuit 1. Hence, the first flip-circuit 1 is not reset.

With the timing T1, the synchronizing signal terminal 4 is at the low level L (T1:TP1), the input line 1d is at the high level H (T1:TP2), the output line 2a of the second flip-flop circuit 2 is at the low level L (T1:TP3), the output line 9d of the NAND element 9 is at the high level H (T1:TP6), the reset terminal 6 is at the high level H (T1:TP7), and the output line 1a connected to the Q terminal of the first flip-flop circuit 1 is at the low level L (T1:TP8).

Thereafter, when the first synchronizing signal (SYN1 in FIG. 1) is applied to the terminal 4 with the timing T2 (T2:TP1), in response to the synchronizing signal the first flip-flop circuit 1 latches the high level H of the input line 1d (T2:TP2), and the output line 1a connected to the Q terminal is raised to the high level H (T2:TP8). At the time of receiving the first synchronizing signal (SYN1), the output line 1a which is extended from the Q terminal of the first flip-flop circuit 1 and connected to the D terminal of the second flip-flop circuit 2 is at the low level. This low level L is latched, and the output line 2a extended from the Q terminal of the second flip-flop 2 is set to the low level L (T2:TP3). Therefore, the output of the first flip-flop circuit 1 is raised to the high level H, while the output of the second flip-flop circuit 2 is set to the low level L.

On the other hand, the input line 3Ba connected to the cancel signal terminal 7 is set to the low level L (T2:TP4). The output line 3Ac of the NOR element 3A is at the low level L similarly as in the case of the timing T1, and therefore the output line 3Bb of the NAND element 3B is raised to the high level H. Hence, the output line 1b of the AND element 3C is raised to the high level H (T2:TP5), and this high level H is applied through the inverter to the reset input terminal RESET of the first flip-flop circuit 1; that is, the low level L is applied to the terminal RESET of the circuit 1. Therefore, the first flip-flop circuit 1 is not reset. The output line 9d of the NAND element 9 is at the high level H (T2:TP6), and the reset terminal 6 is at the high level H (T2:TP7).

Thereafter, when the cancel signal (CAN2) is provided with the timing T3, the input line 3Ba connected to the cancel signal terminal 7 is raised to the high level H (T3:TP4). The output line 2a extended from the Q terminal of the second flip-flop 2 is at the low level L, and the one input line 3Aa of the NOR element 3A is also at the low level L; however, the other input line 3Ab is at the high level H (T3:TP2) because of the presence of the input signal, the output line 3Ac of the NOR element 3A is set to the low level L, and the output line 3Ba of the NAND element 3B is raised to the high level H. Therefore, the output line 1b of the AND element 3C is raised to the high level H (T3:TP5), and this high level H is applied through the inverter to the reset input terminal RESET of the first flip-flop circuit 1; that is, the low level L is applied to the terminal RESET of the circuit 1. Therefore, the first flip-flop circuit 1 is not reset.

With this timing T3, the synchronizing signal terminal 4 is at the low level L (T3:TP1), the output line 2a of the second flip-flop circuit 2 is at the low level L (T3:TP3), the output line 9d of the NAND element 9 is at the high level H (T3:TP6), the reset terminal 6 is at the high level H (T3:TP7), and the output line 1a extended from the Q terminal of the first flip-flop circuit 1 is at the high level H (T3:TP8).

In the embodiment, one cancel signal is applied after the first synchronization signal; however, the invention is not limited thereto or thereby. That is, the apparatus may be so modified that a plurality of cancel signals are applied after the first synchronizing signal. In this case, for the period of time which elapses from the time instant that the first synchronizing signal is generated until several cancel signals are produced thereafter, the D terminal and the Q terminal of the first flip-flop circuit 1 are both maintained at the high level H, while the Q terminal of the second flip-flop circuit 2 is maintained at the low level L.

After the aforementioned cancel signal (CAN2), with the timing T4 the first and second flip-flop circuits 1 and 2 receive the second synchronizing signal (SYN2) at the same time. In response to the application of the second synchronizing signal (SYN2) to the terminal 4 (T4:TP1), the first flip-flop circuit 1 latches the high level H (T4:TP2) of the input line 1d, and raises the output line 1a extended from the Q terminal to the high level H (T4:TP8). At the time of receiving the second synchronizing signal (SYN2), the output line 1a, which is extended from the Q terminal of the first flip-flop circuit 1 and connected to the D terminal of the second flip-flop circuit 2, is at the high level H, and this high level H is latched, so that the output line 2a of the second flip-flop circuit 2 is raised to the high level H (T4:TP3). As is apparent from the above description, in response to the application of the second synchronizing signal, the output of the second flip-flop circuit 2 is raised to the high level H; that is, the discriminating logic terminal 8 is raised to the high level H. Thus, the generation of the input signal is determined.

On the other hand, in the cancel circuit 3, the input line 3Ba connected to the cancel signal terminal 7 is set to the low level L (T4:TP4), and therefore the output line 3Bb of the NAND element 3B is raised to the high level H. Hence, the output line 1b of the AND element 3C is raised to the high level H (T4:TP5). This high level is applied through the inverter to the reset input terminal RESET of the first flip-flop circuit 1; that is, the low level L is applied to the terminal RESET of the circuit 1. Therefore, the first flip-flop circuit 1 is not reset. The input lines 9b and 9c of the NAND element 9, and the output line 2a connected to the Q terminal of the second flip-flop circuit 2 are all at the high level H, while the input line 9a connected to the cancel signal terminal 7 is at the low level L. Therefore, the output line 9d of the NAND element 9 is raised to the high level H (T4:TP6), and the reset terminal is at the high level H (T4:TP7).

When the generation of the input signal is determined in the above-described manner, the input signal determining apparatus A is placed in the initial state with the timing T5 so as to be ready for determination of a new input signal. That is, a reset signal RS is externally applied to the reset terminal 6 which has been at the high level H at all times, so that the reset terminal 6 is set to the low level L (T5:TP7).

As a result, the input line 3Ca of the AND element 3C in the cancel circuit 3 is set to the low level L, whereby the output line 1b of the AND element 3C is set to the low level L (T5:TP5) independently of the level of the input line 3Bb. This low level L is applied through the inverter to the reset input terminal RESET of the first flip-flop circuit 1; that is, the high level H is applied to the terminal RESET of the circuit 1. Therefore, the first flip-flop circuit 1 is reset.

When the reset terminal 6 is set to the low level L as was described above, the input line 2b of the second flip-flop circuit 2 is set to the low level L (T5:TP7), and this low level is applied through the inverter to the reset input terminal RESET of the second flip-flop circuit 2; that is, the high level H is applied to the terminal RESET of the circuit 2. Therefore, the second flip-flop circuit 2 is also reset. Thus, the input signal determining apparatus A has been placed in the initial state.

In the above-described embodiment, after the generation of the input signal, one cancel signal (CAN1) is applied prior to the synchronizing signal (SYN1); however, the invention is not limited thereto or thereby. That is, the embodiment may be so modified that, after the generation of the input signal, the synchronizing signal (SYN1) is firstly applied.

Now, the operation of the input signal determining apparatus of the invention which is carried out to eliminate a non-significant input signal, will be described with reference to FIGS. 4 and 5.

As shown in FIG. 4, in the case where the input signal V is not normal, or a noise is generated which may be mistaken for the input signal V, a significant level is detected with the first synchronizing signal SYN1 or cancel signal CAN1; however, soon it attenuates or disappears.

When such an input signal is generated, the operations of the apparatus which are ranged from the operation which is based on the cancel signal CAN1 applied with the timing T11 to the operation which is based on the synchronizing signal SYN1 applied with the timing T12 are the same as those in the above-described case where a normal input signal is applied thereto.

After the timing T12, the input signal V disappears. Thereafter, when the cancel signal CAN2 is produced with the timing T13, the input line 3Ba connected to the cancel signal terminal 7 is raised to the high level H (T13:TP4). The output line 2a connected to the Q terminal of the second flip-flop circuit 2 is at the low level L, and the one input line 3Aa of the NOR element 3A is at the low level L, while the other input line 3Ab is at the low level L because of the disappearance of the input signal (T13:TP2), and the output line 3Ac of the NOR element 3A is raised to the high level H, and the output line 3Bb of the NAND element 3B is set to the low level L. Therefore, the output line 1b of the AND element 3C is set to the low level L (T13:TP5), and this low level L is applied through the inverter to the reset input terminal RESET of the first flip-flop circuit 1; that is, the high level H is applied to the terminal RESET of the circuit 1. Hence, the first flip-flop circuit 1 is reset. As a result of the resetting of the first flip-flop circuit 1, the output line 1a connected to the Q terminal of the circuit 1 is also set to the low level L—in this connection, it should be noted that the truth table in FIG. 5 indicates the high level H (T13:TP8) before the execution of the resetting operation.

With the timing T13, the synchronizing-signal terminal 4 is at the low level L (T13:TP1), and the output line 2a of the second flip-flop circuit 2 is at the low level L (T13:TP3), and the output line 9d of the NAND element 9 is at the high level H (T13:TP6), and the reset terminal 6 is at the high level H (T13:TP7).

After the cancel signal (CAN2), with the timing T14 the first and second flip-flop circuits 1 and 2 receive the second synchronizing signal (SYN2) at the same time. When the second synchronizing signal (SYN2) is applied to the terminal 4 (T14:TP1), in response to the synchronizing signal (SYN2) the first flip-flop circuit 1 latches the low level L (T14:TP2) of the input line 1d, and sets the output line 1a connected to the Q terminal to the low level L (T14:TP8). At the time of receiving the second synchronizing signal (SYN2), the output line 1a connected between the Q terminal of the first flip-flop circuit 1 and the D terminal of the second flip-flop circuit 2 is at the low level L. This low level L is latched, and the output line 2a connected to the Q terminal of the second flip-flop circuit 2 is set to the low level L (T14:TP3). As is apparent from the above description, the first flip-flop circuit 1 is reset by the cancel signal (CAN2) prior to the inputting of the second synchronizing signal. Hence, the erroneous recognition of the signal at the time of application of the first synchronizing signal is reset; that is, the erroneous operation is eliminated.

As was described above, in the input signal determining method of the invention, the level of the input signal is detected at least twice, and if, after the first detection, the level of the input signal is not maintained for the predetermined time before the second detection starts, the result of the first detection is reset. Hence, the erroneous recognition of an abnormal input signal or noises can be avoided; that is, the determination of the input signal is high in reliability.

In the input signal determining apparatus, the first detection of the input signal is stored in the first flip-flop circuit, and if no input signal is present when the cancel signal is applied thereafter, then the cancel circuit applies the reset signal to the first flip-flop circuit to reset the latter, whereby the storage of the first detection of the input signal is reset. Hence, the erroneous recognition of the input signal can be avoided, and a noise equal in period to the synchronizing signal can be effectively eliminated. Thus, the operation of the input signal determining apparatus of the invention is high in reliability.

Furthermore, the apparatus is made up of two flip-flop circuits, and one cancel circuit; that is, it is small in the number of logic circuits. Accordingly, it is low in manufacturing cost, and simple both in adjustment and in maintenance.

What is claimed is:

1. An input signal determining method in which a level of an input signal is detected at least twice with a predetermined period, comprising the steps of:

determining whether or not the input signal is a continuous input signal whose level is maintained unchanged for a predetermined time before a second detection is started which is carried out in the predetermined period when the level of the input signal is significant at a first detection;

resetting a result of the first detection when the input signal is not the continuous input signal; and determining the input signal as a correct input signal when the level of the input signal is maintained unchanged for the predetermined time and is significant at the second detection.

2. An input signal determining apparatus comprising:

a first flip-flop circuit which receives at least two synchronizing pulses which are produced with a predetermined period, latches an input signal in response to each of the synchronizing pulses, and has a reset input terminal;

a second flip-flop circuit which receives the at least two synchronizing pulses, and latches an output signal of said first flip-flop circuit as an input signal in response to each of the synchronizing pulses; and a cancel circuit which is connected to the reset input terminal of said first flip-flop circuit, and applies a reset signal to the reset input terminal when no input signal is available at the time of application of a cancel signal.

3. The apparatus according to claim 2, wherein said cancel circuit comprises a plurality of logic elements.

4. The apparatus according to claim 2, wherein said cancel circuit comprises a NOR element to which the input signal and an output signal of said second flip-flop circuit are applied, a NAND element to which an output signal of said NOR element and the cancel signal are applied, and an AND element to which an output signal of said NAND element and an external reset signal are applied, an output terminal of said AND element being connected to the reset input terminal of said first flip-flop circuit.

* * * * *